United States Patent [19]

Morishita et al.

[11] Patent Number: 4,470,004
[45] Date of Patent: Sep. 4, 1984

[54] CHARGE INDICATING SYSTEM

[75] Inventors: Mitsuharu Morishita; Shinichi Kouge, both of Hyogo, Japan

[73] Assignee: Mitsubishi Denki Kabushiki Kaisha, Tokyo, Japan

[21] Appl. No.: 478,126

[22] Filed: Mar. 23, 1983

[30] Foreign Application Priority Data

Mar. 23, 1982 [JP] Japan .................................. 57-47927

[51] Int. Cl.³ ........................... H02J 7/14; H02P 9/00
[52] U.S. Cl. ........................................ 322/99; 320/64; 322/28
[58] Field of Search ....................... 322/28, 29; 320/48, 320/64, 68

[56] References Cited

U.S. PATENT DOCUMENTS 3,942,097  3/1976  Itoh et al. .......................... 322/99 X
4,316,134  2/1982  Balan et al. ............................ 322/99

Primary Examiner—R. J. Hickey
Attorney, Agent, or Firm—Sughrue, Mion, Zinn, Macpeak and Seas

[57] ABSTRACT

A switching element is connected between the connection point of an indicator lamp and a diode and ground and is turned on to allow battery current to pass through the lamp to light the same when it is detected that a rectifier output terminal has fallen to a voltage indicative of the lack of generator output, to thereby indicate a failure or open circuit in a coil energization circuit.

7 Claims, 2 Drawing Figures

CHARGE INDICATING SYSTEM

BACKGROUND OF THE INVENTION

The present invention relates to a charge indicating system which is capable of indicating an interruption in the power generation of a charging generator, when that interruption is caused by the disconnection of an energizing circuit or the like, by generating a voltage difference between a rectified output terminal and a storage battery and by detecting this voltage difference. The subject matter of this application is related to that of copending U.S. application Ser. No. 477,802 and 478,000, filed by the present applicants and commonly assigned.

A system according to the prior art will first be described with reference to FIG. 1. In this figure, reference numeral 1 indicates a three-phase alternating-current generator which is mounted on a vehicle (not shown) or the like and is driven by a engine (not shown). The generator 1 is constructed of three-phase star-connected armature coils 101 and a field coil 102. Numeral 2 indicates a full-wave rectifier for rectifying the a.c. output of the aforementioned generator 1. The rectifier 2 includes first and second rectified output terminals 201 and 202 and a ground terminal 203. Numeral 3 indicates a voltage regulator which is made operative to control the output voltage of the aforementioned generator to a first predetermined value by controlling the field current flowing through the aforementioned field coil 102.

In the regulator 3, numeral 301 indicates a surge absorbing diode connected with both ends of the aforementioned field coil 102. Numerals 302 and 303 indicate Darlington-connected power transistors for interrupting the current to be supplied to the aforementioned field coil 102. Numeral 304 indicates a resistor which constitutes the base circuit of the transistors 302 and 303. Numeral 305 indicates a control transistor for turning the aforementioned transistors 302 and 303 on and off. Numeral 306 indicates a Zener diode for detecting the voltage of the second rectified output terminal 202 of the aforementioned rectifier, and rendered conductive when the output voltage detected reaches the first predetermined value. Numerals 307 and 308 indicate resistors connected in series with each other to construct a voltage dividing circuit. Numeral 309 indicates an initial coil energization resistor connected in parallel with a charge indicating lamp 6, for supplying an initial energization current to the aforementioned generator 1 even if the indicating lamp 6 is disconnected. Numerals 4 and 5 indicate a storage battery and a key switch, respectively.

The operation of the prior art system thus constructed will now be described. When the key switch 5 is closed to start the engine, the transistors 302 and 303 are supplied with base current from the battery 4 through the key switch 5 and the resistor 304 so that they are rendered conductive. When the transistors 302 and 303 become conductive, the battery 4 supplies field current to the field coil 102 through the key switch 5, the charge indicating lamp 6, the resistor 309, the field coil 102 and transistors 302 and 303 so that a field magnetomotive force is generated.

When the engine is started in this state so that the generator 1 is driven, an a.c. output is induced in the armature coils 101 in accordance with the engine r.p.m. and is full-wave rectified by the full-wave rectifier 2. At this time, the rectified output is lower than the first predetermined value and the voltage at the voltage driving point of the voltage driving circuit, which is constructed of the resistors 307 and 308, is still low. As a result, the Zener diode 306 is not yet conductive but maintains its nonconductive state so that the supply of field current is maintained. As a result, the output voltage of the generator 1 is raised in accordance with the rise in generator r.p.m.

When this r.p.m. is increased such that the output voltage exceeds the aforementioned first predetermined value, the potential at the dividing point of the aforementioned voltage driving circuit is also increased to render the Zener diode 306 conductive, through which base current is supplied to the transistor 305 so that this transistor 305 is rendered conductive. When the transistor 305 becomes conductive, the transistors 302 and 302 are disconnected to interrupt the current flowing through the field coil 102, so that the output voltage of the generator 1 drops.

When the output voltage has fallen to the first predetermined value, the Zener diode 306 and the transistor 305 are rendered nonconductive, and the transistors 302 and 303 are rendered conductive to energize the field coil 102, so that the output voltage of the generator 1 is again raised.

By repeating the operations thus far described, the output voltage of the generator 1 is controlled to the aforementioned predetermined value so that the battery 4 is charged with the controlled voltage. At this time, on the other hand, the output voltage of the second rectifier output terminal 202 reaches the first predetermined value so that there is no potential difference between it and the battery 4. As a result, the charge indicating lamp 6 is turned off to indicate the charged state of the battery 4.

In the prior art system thus far described, however, if the coil energizing circuit is partially disconnected, the charge indicating lamp 6 is not lit even when the generator 1 generates no output power. This creates a defect in that this state is not detected, to invite the full discharge of the battery.

SUMMARY OF THE INVENTION

In view of the foregoing deficiencies of the prior art, the present invention contemplates the provision of a charge indicating system which eliminates these defects and indicates a non-generation state to the vehicle operator.

DETAILED DESCRIPTION OF THE PREFERRED EMBODIMENTS

Figure 1:
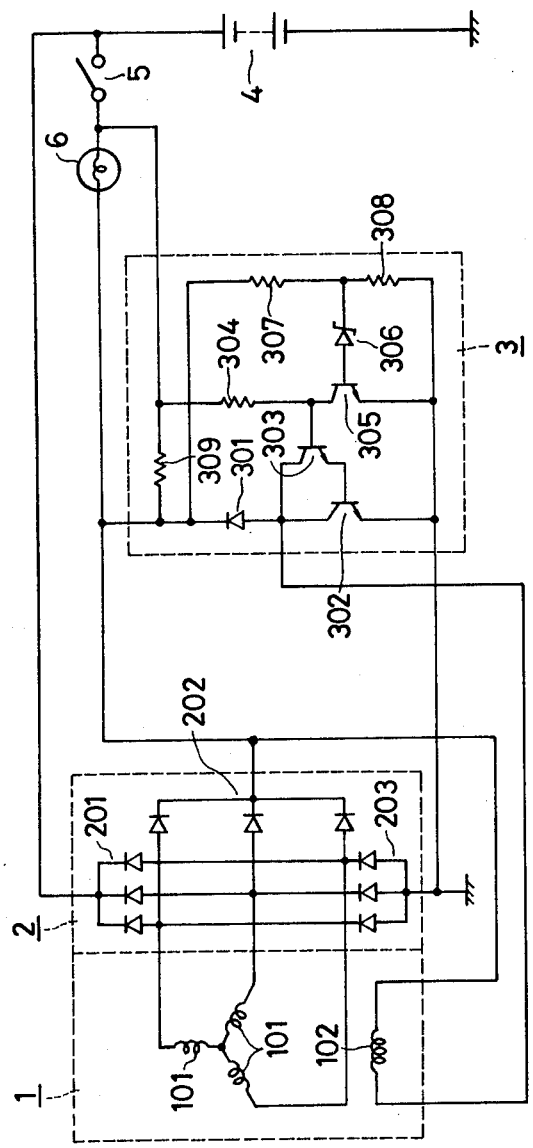
FIG. 1 is a circuit diagram showing a generator system according to the prior art.
Figure 2:
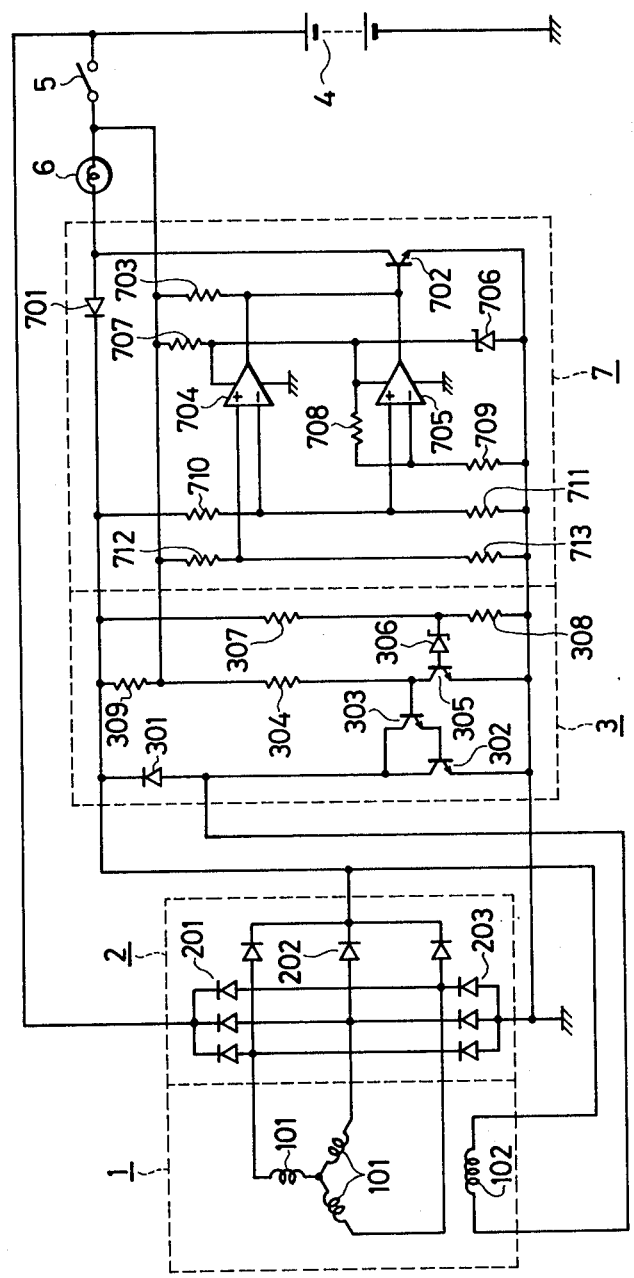
FIG. 2 is a circuit diagram showing an embodiment according to the present invention.

The present invention will now be described in connection with one embodiment thereof with reference to FIG. 2. In FIG. 2, reference numeral 7 indicates a coil energization circuit disconnection detector which is made operative to light the aforementioned charge indicating lamp 6 by establishing a voltage difference between the second rectifier output terminal 202 and the terminal of the battery 4 when the energizing circuit is disconnected, and by detecting this voltage difference. The detector is constructed as follows.

Specifically, numeral 701 indicates a diode which has its anode connected to the charge indicating lamp 6 and its cathode connected to the second rectifier output terminal 202. Numeral 702 indicates a transistor or a switching element connected between the connection of the charge indicating lamp 6 and the diode 701 and ground. Numeral 703 indicates a resistor connected to the base of the transistor 702. Numeral 704 indicates a comparator for driving the aforementioned transistor 702 when the energizing circuit is disconnected. A comparator 705 interrupts the transistor 702 when the voltage at the second rectifier output terminal 202 is lower than a second predetermined value (during an initial energization stage). A Zener diode 706 supplies the power source voltage of the aforementioned comparators 704 and 705. Numeral 707 indicates a resistor for supplying current to the Zener diode 706. Resistors 708 and 709 are connected in series with one another to divide the voltage of the aforementioned Zener diode 706 to thereby supply the second predetermined value to the aforementioned comparator 705. Resistors 710 and 711 are connected in series to divide the voltage of the second rectifier output terminal 202 to thereby supply the divided voltage to the aforementioned comparators 704 and 705. Resistors 712 and 713 are connected in series to divide the terminal voltage of the battery 4 and supply this voltage to the energization circuit disconnection detecting comparator 704 when the key switch 5 is closed.

The operation of the system thus constructed according to the present invention will now be explained.

When the key switch 5 is closed to start the engine, the battery 4 supplies field current to the field coil 102 through the key switch 5, the charge indicating lamp 6, the diode 701, the resistor 309, the field coil 102 and the transistors 302 and 303 so that a field magnetomotive force is generated and so that the charge indicating lamp 6 is lit to indicate the non-charging state. At this time, the voltage at the second rectifier output terminal 202 is low, because the generator 1 does not yet generate power, compared to the terminal voltage at the battery 4. The voltage at terminal 202 is determined by the ratio of a composite resistance of a resistance component of the lamp 6 and the resistor 309, and the resistance component of the field coil 102. As a result, the comparator 704 is turned off to thereby turn on the transistor 702. On the contrary, the comparator 705 is turned on, because the voltage of the second rectifier output terminal 202 is below the second predetermined value, to render the transistor 702 nonconductive. As a result, the current flowing from the charge indicating lamp 6 to the field coil 102 is not shunted to the transistor, and the speed at which the a.c. generator 1 begins its generating operation is not raised so that no influence is exerted upon the generator's characteristics.

Next, when the engine is started so that the generator 1 generates an output voltage, and when the first predetermined value is obtained by control of the voltage regulator 3, little difference exists between the voltages at the second rectifier output terminal 202 and the terminal of the battery 4, so that the charge indicating lamp 6 is extinguished to indicate the charged state of the battery 4. If, in this state, an open circuit is created at the field coil 102 forming a part of the energization circuit, at the transistors 302 and 303 or in the wiring, the voltage at the second rectifier output terminal 202 becomes lower than the voltage of the battery 4 because the a.c. generator 1 generates no power. The comparator 704 is turned off by this voltage difference so that the transistor 702 is rendered conductive by the supply of base current from the base resistor 703 to thereby light the charge indicating lamp 6. In this case, the voltage at the second rectifier output terminal 202 is determined by the ratio between the series resistance of the resistors 710 and 711 and the parallel resistance of the charge indicating lamp 6 and the resistor 309.

The resistance of the resistor 711 is adjusted so that this voltage may be set at a level such as can be detected as the voltage difference from the battery terminal voltage by the comparator 704, and as higher than the second predetermined value (i.e. the rise regulating voltage) of the comparator 705. In this embodiment, moreover, comparators 704 and 705 are used. Nevertheless, similar effects can be attained a combination of a Zener diode and a transistor.

As has been described in detail hereinbefore, the system of the present invention makes use of the fact that the voltage at the second rectifier output terminal 202 is lower, when the a.c. generator 1 has its power generation interrupted as a result of a disconnection of the energization circuit, than the terminal voltage of the battery 4 by a voltage which is determined by the ratio between the series resistance of the resistors 710 and 711 and the parallel resistance of the charge indicating lamp 6 and the resistor 309. As a result, the system of the present invention lights the charge indicating lamp 6 by detecting this voltage difference by means of the comparator 704 and by driving the transistor 702. At the start of power generation of the a.c. generator 1, moreover, the second predetermined value is set as the reference voltage for the comparator 705 so that driving of the charge indicating lamp 6 by the transistor 702 may be suppressed to prevent the generator rising characteristics from being degraded. Incidentally, since comparators 704 and 705 are used for detecting the voltage difference, it is possible to detect the voltage difference highly accurately. Moreover, since the series resistance of the resistors 710 and 711 need not be set at an extremely low level, the power loss at the resistors 710 and 711 can be reduced to provide a system having little heat liberation. Thus, the present invention provides an effect such that heat liberation and the external size can be minimized by the use of a simplified system without inviting a reduction in the operating characteristics.

As has been described hereinbefore, according to the present invention, the charge indicating system is constructed to comprise a charge indicating lamp connected between the second output terminal of the rectifier and the storage battery and in series with the key switch; a diode having its anode and cathode respectively connected in series with the indicating lamp and the second rectifier output terminal; a voltage regulator for controlling the output voltage of the generator to a first predetermined value by interrupting the current supplied to the field coil; and a switching element connected between the connecting point of the charge indicating lamp and the diode and ground and adapted to be rendered conductive to light the charge indicating lamp if the voltage at the second rectifier output terminal is lower than the voltage of the storage battery but higher than a second predetermined value. Thus, the non-charging state of the generator can be indicated without fail, and the battery can be prevented from becoming discharged.

What is claimed is:

1. A charge indicating system, comprising: a rectifier having first and second rectifier output terminals and a ground terminal for rectifying an alternating-current output induced at the armature coils of a charging generator; a storage battery charged by the output at the first rectifier output terminal; a field coil disposed in said charging generator and connected to the second rectifier output terminal; a charge indicating lamp connected between said second rectifier output terminal and said storage battery and in series with a key switch; a diode having its anode and cathode respectively connected in series with said indicating lamp and said second rectifier output terminal; a voltage regulator for controlling the output voltage of said generator to a first predetermined value by interrupting the current supplied to said field coil; and a switching element connected at one terminal between said charge indicating lamp and said diode and at another terminal to ground, and for operating to light said charge indicating lamp when the voltage at said rectifier output terminal is lower than the voltage of said storage battery but higher than a second predetermined value, said second voltage value being lower than said first predetermined value but above a second rectifier output voltage normally existing during the initial start-up of said charging generator.

2. A system as claimed in claim 1, including means for rendering said switching element conductive, comprising comparator means for comparing said voltage at said second rectifier output terminal with said battery voltage and said second predetermined value.

3. A system as claimed in claim 2, said comparator means comprising a first comparator receiving inputs proportional to said battery voltage and to said second rectifier output terminal voltage, respectively, for generating an output signal to render said switching element conductive when the latter input is smaller than the former.

4. A system as claimed in claim 3, said comparator means further comprising a second comparator receiving said latter input and said second predetermined value, to prevent said switching element from being rendered conductive when said latter input is less than said second predetermined value.

5. A system as claimed in claim 4, said second predetermined value comprising a voltage value lower than said first predetermined value but above a second rectifier output voltage normally existing during the initial start-up of said charging generator.

6. A system as claimed in claim 1, wherein said switching element comprises a transistor.

7. A system as claimed in claim 2, wherein said switching element comprises a transistor controlled according to an output of said comparator means.

* * * * *